(12) United States Patent
Cassiday et al.

(10) Patent No.: US 6,931,581 B1
(45) Date of Patent: *Aug. 16, 2005

(54) METHOD FOR SUPERIMPOSING A SEQUENCE NUMBER IN AN ERROR DETECTION CODE IN A DATA NETWORK

(75) Inventors: Daniel R. Cassiday, Topsfield, MA (US); Randall D. Rettberg, Danville, CA (US); David L. Satterfield, Tewksbury, MA (US); Thomas J. Moser, Acton, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 577 days.

This patent is subject to a terminal disclaimer.

(21) Appl. No.: 09/697,731

(22) Filed: Oct. 25, 2000

(51) Int. Cl.[7] .............................................. H03M 13/00
(52) U.S. Cl. ...................................... 714/758; 714/776
(58) Field of Search ................................ 714/758, 776, 714/701, 752, 807, 751; 370/395.1, 242, 473, 466; 380/283

(56) References Cited

U.S. PATENT DOCUMENTS

| | | | |
|---|---|---|---|
| 5,742,640 A | * | 4/1998 | Haoui et al. |
| 5,923,681 A | * | 7/1999 | Denton |
| 5,935,268 A | * | 8/1999 | Weaver ....................... 714/758 |
| 6,084,888 A | * | 7/2000 | Watanabe et al. ........... 370/473 |
| 6,189,124 B1 | * | 2/2001 | Glaise ......................... 714/758 |
| 6,209,112 B1 | * | 3/2001 | Stevenson ................... 714/752 |
| 6,252,888 B1 | * | 6/2001 | Fite, Jr. et al. ............. 370/466 |
| 6,493,847 B1 | * | 12/2002 | Sorgi et al. |
| 6,539,094 B1 | | 3/2003 | Osakabe et al. |
| 6,542,470 B1 | | 4/2003 | Honig et al. |
| 6,603,986 B1 | * | 8/2003 | Bozoukov |
| 6,667,978 B1 | | 12/2003 | Delp et al. |
| 6,684,363 B1 | * | 1/2004 | Cassiday et al. ............ 714/776 |

FOREIGN PATENT DOCUMENTS

EP        1035682 A1        9/2000

OTHER PUBLICATIONS

Microsoft press, Computer Dictionary The comprehensive standard for business, school, library, and home) second edition, 1993, p. 114.*

* cited by examiner

*Primary Examiner*—Phung My Chung
(74) *Attorney, Agent, or Firm*—Meyertons Hood Kivlin Kowert & Goetzel, P.C.; B. Noël Kivlin

(57) ABSTRACT

A system and method for superimposing a sequence number of a packet into the CRC segment of the packet thereby allowing more bandwidth in the payload portion of the packet for carrying data is described. Also described is a method of acquiring additional information on the type of error in a packet, e.g., data transmission errors or sequence errors, from analyzing a CRC error. For example, a reported CRC error can be the result of the receipt of a packet with a sequence number the receiver is not expecting (which is a normal occurrence on transmission links due to transmitters resending packets that a receiver has already accepted) or can result from a real error in the transmission of a packet. A first error code check (CRC) value is calculated for the payload segment of a data packet. A second CRC value is calculated for the sequence number of the data packet. The first CRC value and the second CRC value are combined thereby creating a third CRC value. The third CRC value is then combined with the payload segment of the data packet thereby creating a data packet that can be transmitted across the link.

16 Claims, 3 Drawing Sheets

METHOD FOR SUPERIMPOSING A SEQUENCE NUMBER IN AN ERROR DETECTION CODE IN A DATA NETWORK

CROSS-REFERENCE TO RELATED APPLICATIONS

The present application is related to U.S. patent application Ser. No. 09/697,604 filed on Oct. 25, 2000, entitled, "METHOD FOR DETECTING ERRORS ON PARALLEL LINKS", which is now as U.S. Pat. No. 6,684,363 and which is incorporated herein by reference.

BACKGROUND OF THE INVENTION

1. Field of the Invention

The present invention relates generally to data communication networks and the transmission of data in those networks. More specifically, it relates to hardware and data encoding modifications for increasing the throughput and error discrimination of data networks.

2. Discussion of Related Art

As the use of data communication networks becomes increasingly widespread, the need for reliable data transmission through nodes in such networks, the Internet being one example, has become more important. In particular, increasing the amount of data that can be sent over an interconnect link between two nodes has always been a goal of data networks. Users expect networks to deliver data faster and at the same time more reliably. One way data can be delivered with higher throughput is ensuring that the payload portion of a data packet is carrying as much actual data as possible; that is, minimizing space taken up by various encoding and CRC bits found in most data packets. These various encoding bits are necessary for ensuring that data is delivered reliably and error-free.

Presently, a significant portion of the payload of a data packet is used for transmitting packet sequence numbers, necessary for ensuring that packets are received in order and that all expected packets are received. FIG. 1 is a block diagram of a single-flit data packet excluding the packet's 11 inversion bits. Thus, only 77 of the 88 bits are shown. A typical single-flit packet has 47 bits available for carrying payload data and 30 bits used for CRC checking used for checking the accuracy of the data sent. Of the 47 bits that can be used for carrying actual data, eight bits are presently being used for transmitting a sequence number for the packet. This leaves only 39 bits, out of an 88-bit data packet for carrying payload data. By eliminating the need to transmit the sequence number data as part of the payload, the payload portion of the packet used for carrying data would increase by approximately 15%; eight extra bits in each packet.

As mentioned, each packet has 11 invert bits, one for each 8-bit word in an 88-bit packet. An invert bit indicates whether its corresponding seven bits should be inverted or left unmodified at the receiver. Thus, if a single invert bit is corrupted during transmission over the link, the seven associated bits at the receiving end are also corrupted, when in fact they were transmitted accurately but "corrupted"at the receiving end because of the incorrect invert bit. However, the CRC check will show that all eight bits are corrupted. The CRC is presently not able to detect an inversion-bit (or 7-bit error) coding error as opposed to a non-invert bit error. As is known in the field, the CRC check is important; if the CRC check matches, the packet can be used, if not, the packet is considered corrupt and is dropped and resent.

Therefore, it would be desirable to increase the bandwidth of a link by utilizing the maximum number of bits in the payload segment of a data packet. This can be done by taking the sequence number of a data packet out of the payload segment and encoding it in the CRC section of a packet. It would also be desirable to have the CRC check convey more information about errors it detects, such as whether a CRC check failure is the result of an out-of-sequence packet (which is not a data transmission error) or is a true data transmission error.

SUMMARY OF THE INVENTION

Methods and apparatus for preparing a data packet for transmission over an interconnect link and detecting errors in the packet when sent over the link in the data network is described. In one aspect of the invention, a method of preparing a message before sending it over an interconnect link is described. A first error code check value, such as a CRC value, is calculated for the payload segment of a data packet. A second CRC value is calculated for the sequence number of the data packet. The first CRC value and the second CRC value are combined thereby creating a third CRC value. The third CRC value is then combined with the payload segment of the data, packet thereby creating a data packet that can be transmitted across the link.

In one embodiment, the sequence number is extracted from the data packet before the second CRC value for the sequence number is calculated. The sequence number includes the sequence number and the ONID value. In another embodiment, the first CRC value and the second CRC value are combined using an exclusive OR (XOR) function, thereby producing a third CRC value. In another embodiment, the third CRC value is combined with the payload of the data packet resulting in a 77-bit data segment.

BRIEF DESCRIPTION OF THE DRAWINGS

The invention will be better understood by reference to the following description taken in conjunction with the accompanying drawings in which.

DETAILED DESCRIPTION

Reference will now be made in detail to a preferred embodiment of the invention. An example of the preferred embodiment is illustrated in the accompanying drawings. While the invention will be described in conjunction with a preferred embodiment, it will be understood that it is not intended to limit the invention to one preferred embodiment.

To the contrary, it is intended to cover alternatives, modifications, and equivalents as may be included within the spirit and scope of the invention as defined by the appended claims.

A system and method for superimposing a sequence number of a packet into the CRC segment of the packet thereby allowing more bandwidth in the payload portion of a packet for carrying data is described in the various figures. Also described is a method of acquiring additional information on the type of error in a packet, e.g., data transmission errors or sequence errors, from analyzing a CRC error. For example, is a reported CRC error the result of the receipt of a packet with a sequence number the receiver is not expecting (which is a normal occurrence on transmission links due to transmitters resending packets that a receiver has already accepted) or due to a real error in the transmission of a packet?

Figure 1:
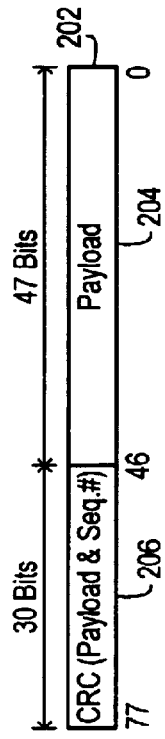
FIG. 1 is a block diagram of a single-flit data packet excluding the packet's 11 inversion bits.
Figure 2:
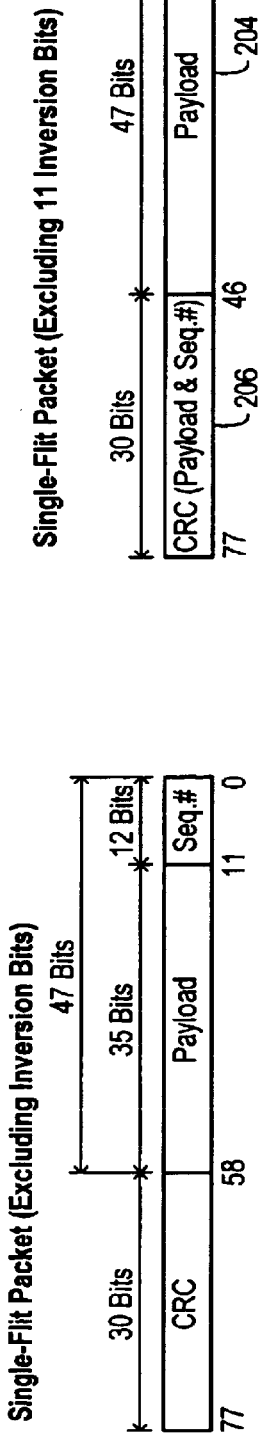
FIG. 2 is a logical block diagram of a data network having three nodes and three links used to illustrate one embodiment of the present invention.

FIG. 2 is a block diagram showing the bit segments of a single-flit data packet in accordance with one embodiment of the present invention. A data packet 202 shows 77 bits, excluding 11 inversion bits, comprising a total of 88 bits typically transmitted in one clock cycle, i.e., one flit. Packet 202 has a total of 47 bits that can be used for transmitting payload data, shown as segment 204. A total of 30 bits is used for the CRC, shown as segment 206. The CRC segment contains a CRC for the payload and for an 8-bit sequence number of the data packet. As described above, the sequence number is typically part of the segment 204, leaving only 39 bits in the payload segment for actual data.

Figure 3:
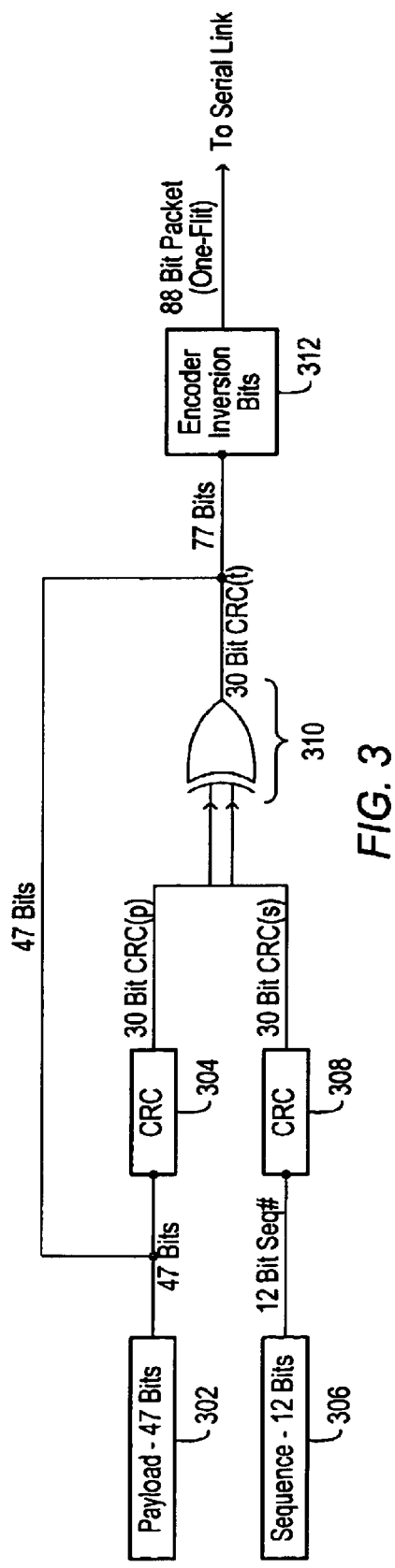
FIG. 3 is a block diagram illustrating various components in a node needed for transmitting a data packet with a superimposed sequence number in the CRC in accordance with one embodiment of the present invention.

FIG. 3 is a block diagram illustrating various components in a node needed for transmitting a data packet with a superimposed sequence number in the CRC in accordance with one embodiment of the present invention. A payload segment 302 having 47 bits is input to a CRC generator 304. Payload segment 302 does not contain a sequence number. A sequence number segment 306 having 8 bits is input to a CRC generator 308. CRC component 304 outputs a 30-bit CRC code, labeled as CRC(p) for payload. CRC component 308 takes the 8-bit sequence number and outputs a 30 bit CRC code, referred to as CRC(s), for sequence number. The two 30-bit CRC values are then input to an XOR component 310. The two values are XORed together to produce a third 30-bit CRC value that inherently contains a CRC for the payload and the sequence number. This 30-bit CRC value is then combined with the unaltered 47-bit payload segment 302.

Figure 4A:
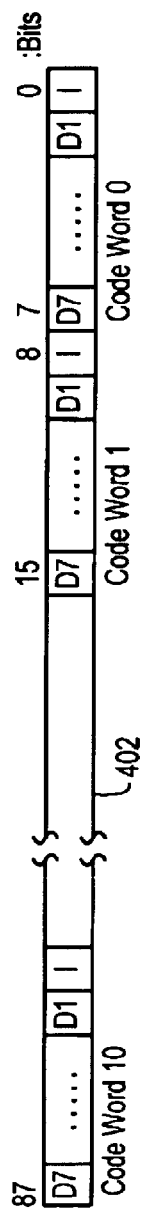
FIG. 4A is an illustration of a single-flit data packet and the placement of inversion bits in accordance with one embodiment of the present invention.

A 77-bit data segment is then input into an encoder 312. The encoder inserts multiple inversion bits into the 77-bit data segment. As mentioned above, a single-flit data packet has 88 bits, or 11 18-bit words. Each word has seven bits of data and one inversion bit. FIG. 4A is an illustration of a single-flit data packet and the placement of inversion bits in accordance with one embodiment of the present invention. A single-flit packet 402 has 11 code words, labeled from Code Word 0 to Code Word 10. A typical code word, such as Code Word 0, has seven data bits, bits 1 through 7, and one bit for an inversion bit, such as bit 0, and is sent across an individual data fiber. As is known in the field, an inversion bit is used to invert bits in a corresponding code word. It can be used to maintain DC balance in a data stream as well as controlling run length on fiber optic transmission media.

Once the encoder inserts a zero (leave bits unaffected) or a one (invert bits) in the inversion bit, the resulting 88-bit, single-flit, packet is transmitted onto the parallel fiber optic link. In the described embodiment, the transmitter performs the encoding of the 77-bit data packet. As mentioned, the inversion bit is need ed to maintain DC balance; that is, maintaining the number of 1's and 0's over the serial link, which does not have a DC offset. In addition, the run length, the number of consecutive 0's or 1's, is kept under a threshold number.

Figure 4B:
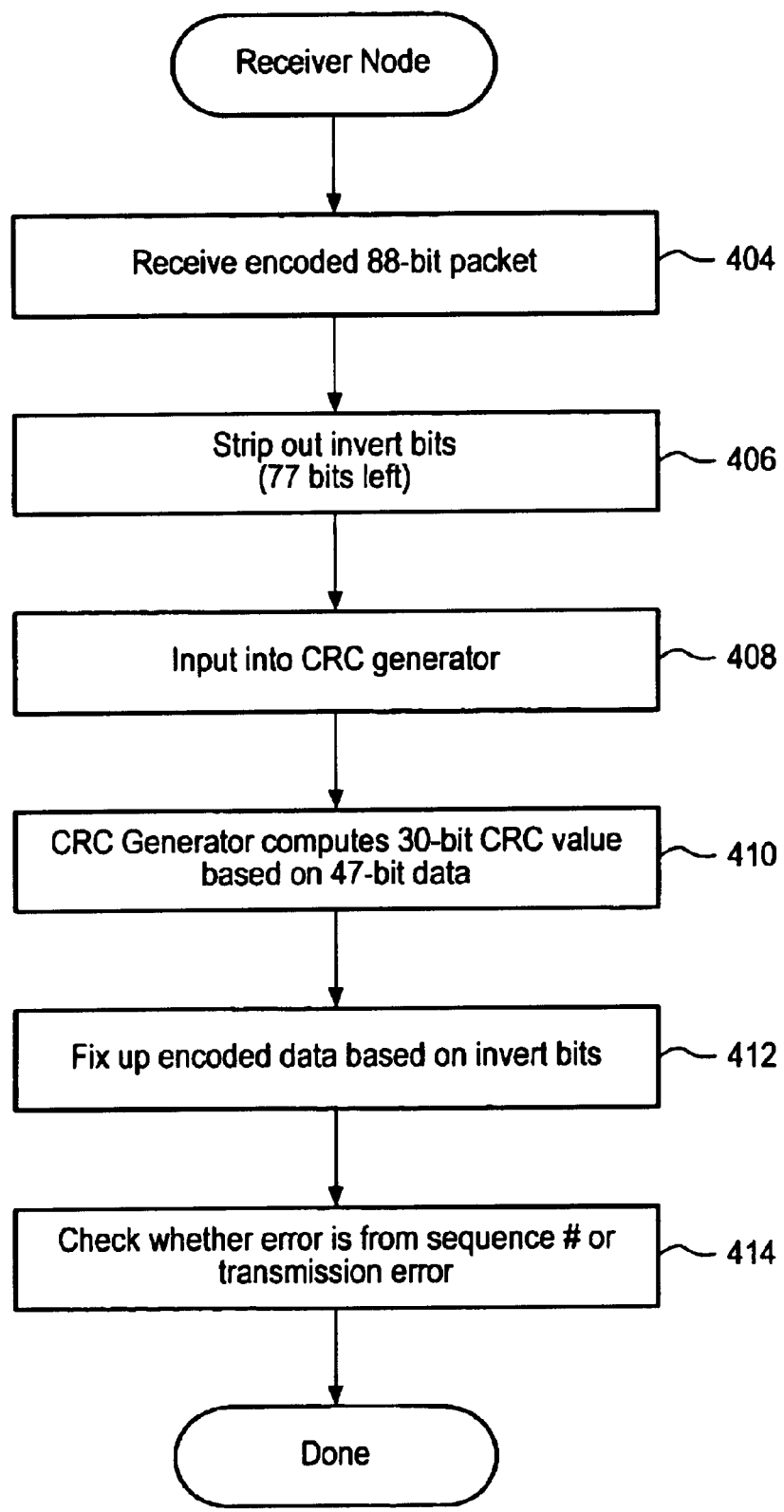
FIG. 4B is a flow diagram of a process of receiving an encoded message in accordance with one embodiment of the present invention.

FIG. 4B is a flow diagram of a process of receiving an encoded message in accordance with one embodiment of the present invention. At step 404 a receiver at the far-end node receives the encoded 88-bit message over the serial link. The composition of th is 88-bit packet is described in FIG. 3. It is helpful to note here that the illustrations described here use one-flit data packets. For two and four-flit data packet s, the number of bits are increased accordingly, e.g., for a two-flit data packet, the number of bits is 176 bits. At step 406 the receiver strips out the 11 invert bits contained in the packet. The actual inversion of the bits according to the invert bits is not performed at this step since such an operation slows the process down. Once the invert bits are stripped out, a 77-bit packet is inputted to a CRC checker at step 408. The CRC then separates the 47 payload bits from the 30 CRC bits. Recall from FIG. 3 that a 30-bit CRC was combined with a 47-bit payload before being inputted to an encoder in the transmitter.

At step 410 the CRC calculator computes a 30-bit CRC value on the 47-bit payload segment of the message. This is the same calculation done at the near-end node by CRC calculator 304 where a 30-bit CRC(t) value was calculated. At step 412 the CRC repairs the CRC result based on the invert bits. The 47-bit data segment has still not been decoded. The CRC then determines which bits need to be inverted or flipped based on whether each code word contributes an odd or even number of bits to each CRC result bit. In the described embodiment, this can be done using a series of exclusive OR (XOR) operations.

At step 414, the CRC checker compares the 30-bit CRC value that it calculated to the CRC(t) value calculated at the near-end node. If there are any differences in the two values, the data packet is dropped and the transmitter at the near-end node will re-send the packet since an acknowledgment will not be received from the far-end. This is done since a difference in CRC values indicates some type of error-in the packet and, therefore, the packet cannot be forwarded. However, the type of error in the packet can be determined with a reasonably high degree of accuracy. In the described embodiment, the type of error in the packet can be determined by examining which CRC bits differ. If the CRC bits differ, the error can be from transmission over the link (transmission error) or from a error, sequence number error, or similar non-transmission errors. As mentioned above, an inversion bit error can cause seven other bits to have an error. Determining what type of error occurred involves examining the first 18 bits of the 30-bit CRC. If these bits are correct, i.e., all zero after the comparison, then there was very likely no error in the transmission of the message. If there are any ones, then there was very likely an error in the transmission. If the lower 12 bits have are not all zero, then there was an error in the sequence number bits or other non-transmission error. It is often useful in the maintenance of a network to have a reasonably accurate count of the number of data packet errors resulting from the transmission link versus other types of errors. A high number of transmission link errors are typically of particular concern to network administrators; these types of errors should receive attention before a catastrophic failure occurs.

Using this process at the receiver of the far-end node, the data packet can have a true 47-bit payload instead of a smaller number such as 35 bits by having the sequence number (plus an ONID value) embedded in the CRC instead of the payload. The packet still has a 30-bit CRC, which it needs to ensure that an acceptable percentage (normally a high percentage) of the packets that have an error are detected. It also accommodates the use of inversion bits and their potential associated 7-bit apparent errors, which are needed to ensure DC balance and appropriate run length.

Figure 4C:
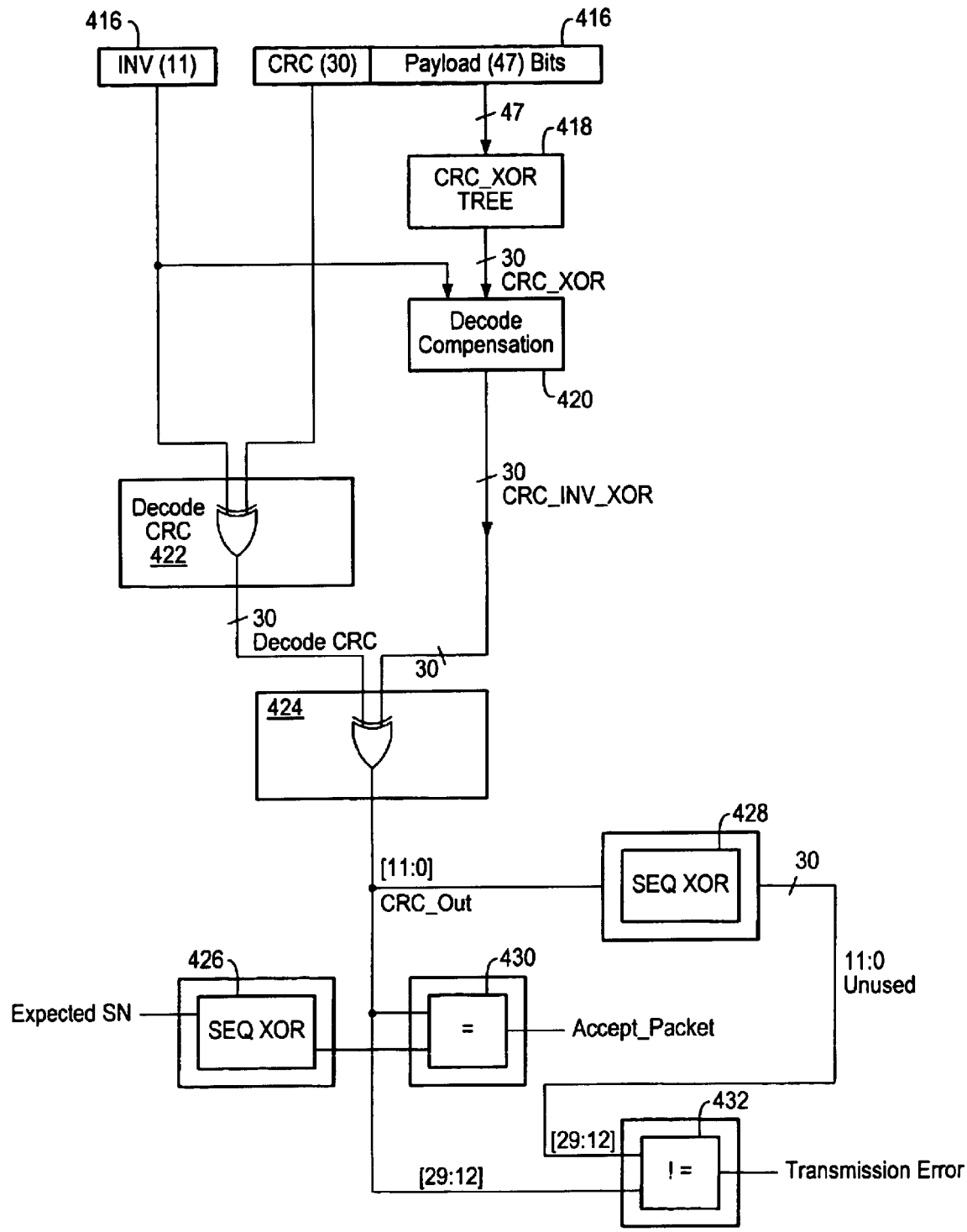
FIG. 4C is a block diagram of a receiver node for receiving a single-flit packet in accordance with one embodiment of the present invention.

FIG. 4C is a block diagram of a receiver node for receiving a single-flit packet in accordance with one embodiment of the present invention. A packet 416 contains 88 bits which, as described above, contains 30 CRC bits, 47 payload bits, and 11 invert bits. A CRC XOR tree 418 computes the CRC of the payload, without compensation for encoding. Decode compensation box 420 removes the effect of encoding on the CRC result in component 418. In the described embodiment, the encoding is a simple invert bit. Thus, each CRC result bit can be examined and a count of the number of bits in the code word associated with the invert bit is derived. A decision is then made to invert each CRC result bit based on how many bits contribute to the CRC result bit being examined. If a particular code word contributes an even number of bits to a given CRC result bit, no correction of the CRC result bit is necessary based on the invert bit for that code word. Each CRC result bit must be examined to see if an even or odd contribution is being made for each code word. It is then decided whether to invert the CRC result of that particular invert bit.

A CRC decode box 422 decodes the CRC in the payload. XOR gate 424 compares the decoded CRC in the packet with the calculated CRC result after decode compensation. At this stage, the message CRC has been removed from the combined CRC result, leaving only the sequence number CRC. If this result matches the sequence XOR computed in box 426, the packet is error free and has the correct sequence number. A sequence number XOR tree 428 takes the lower 12 bits of the output of XOR gate 424 and computes a sequence number CRC (which is a different CRC code than the payload CRC computed above). This is possible because the sequence number CRC XORs passed the sequence number unmodified in the lower 12 bits. The sequence number XORs 426 compute a sequence number CRC value based on the receiver's expected sequence number. An equality checker 430 determines whether a packet should be accepted (i.e., both message CRC and sequence number CRC match). Inequality checker 432 checks that the upper 22 bits of the sequence number CRC calculator 428 match the result of the XOR gate 424. If it matches, there is no transmission error.

Although the foregoing invention has been described in some detail for purposes of clarity of understanding, it will be apparent that certain changes and modifications may be practiced within the scope of the appended claims. Furthermore, it should be noted that there are alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method of preparing a data packet for transmission over an interconnect link, the method comprising:
    calculating a first CRC value for a payload segment of a data packet;
    calculating a second CRC value for a sequence number of the data packet;
    combining the fist CRC value and the second CRC value thereby creating a third CRC value, and
    combining the third CRC value with the payload segment of the data packet thereby creating a transmittable data packet.

2. A method as recited in claim 1 further comprising extracting a plurality of inversion bits from the data packet before calculating the first CRC value for the payload segment.

3. A method as recited in claim 1 further comprising extracting the sequence number from the data packet before calculating the second CRC value for the sequence number thereby allowing more space in the payload segment for data.

4. A method as recited in claim 3 wherein the sequence number produces a 30-bit CRC value.

5. A method as recited in claim 1 wherein combining the first CRC value and the second CRC value further includes performing an exclusive OR between the first CRC value and the second CRC value thereby producing the third CRC value.

6. A method as recited in claim 1 wherein combining the third CRC value with the payload segment results in a 77-bit data segment.

7. A method as recited in claim 1 further comprising inserting a plurality of inversion bits into the transmittable data packet, wherein the plurality of inversion bits maintain DC balance and control run length.

8. A method of decoding an encoded message received over an interconnect link in a network, the method comprising:
    receiving an encoded data packet having a received CRC segment and a payload segment;
    calculating a first CRC value using the payload segment;
    decoding the first CRC value using a plurality of inversion bits;
    decoding the received CRC segment using the plurality of inversion bits;
    comparing the decoded first CRC value and the decoded received CRC segment thereby determining whether the encoded message was received with any errors.

9. A method as recited in claim 8 further comprising removing the plurality of inversion bits from the encoded message.

10. A method as recited in claim 8 further comprising determining whether an error in the encoded message resulted from a transmission error.

11. A method as recited in claim 10 further comprising comparing a first plurality of preselected bits in the decoded received CRC segment with a second plurality of preselected bits in the decoded first CRC value.

12. A method as recited in claim 11 wherein both the first plurality of preselected bits and the second plurality of preselected bits have the same bit positions.

13. A method as recited in claim 8 further comprising determining whether an error in the encoded message resulted from a non-transmission error.

14. A method as recited in claim 13 further comprising comparing a third plurality of preselected bits in the decoded received CRC segment with a fourth plurality of preselected in the decoded first CRC value.

15. A method as recited in claim 13 wherein both the third plurality of preselected bits in the decoded received CRC segment and the fourth plurality of preselected bits in the decoded first CRC value have the same bit position.

16. A method as recited in claim 8 wherein the decoded first CRC value and the decoded received CRC segment have 30 bits wherein the 30 bits includes a CRC value for sequence number.

* * * * *